(12) United States Patent
Gomez et al.

(10) Patent No.: US 9,118,367 B2
(45) Date of Patent: *Aug. 25, 2015

(54) WIDEBAND POWER EFFICIENT HIGH TRANSMISSION POWER RADIO FREQUENCY (RF) TRANSMITTER

(71) Applicant: Broadcom Corporation, Irvine, CA (US)

(72) Inventors: Ray (Ramon) Gomez, San Juan Capistrano, CA (US); Leonard Dauphinee, Costa Mesa, CA (US); Massimo Brandolini, Irvine, CA (US); Jianhong Xiao, Irvine, CA (US); Dongsoo Koh, Irvine, CA (US); Young Shin, Irvine, CA (US); Chonghua Zhong, Irvine, CA (US); Reza Rahman Khan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 168 days.

This patent is subject to a terminal disclaimer.

(21) Appl. No.: 13/849,112

(22) Filed: Mar. 22, 2013

(65) Prior Publication Data

US 2013/0235953 A1 Sep. 12, 2013

Related U.S. Application Data

(63) Continuation of application No. 13/249,741, filed on Sep. 30, 2011, now Pat. No. 8,417,200.

(51) Int. Cl.
*H04B 1/04* (2006.01)
*H03M 1/66* (2006.01)

(52) U.S. Cl.
CPC .............. *H04B 1/0475* (2013.01); *H03M 1/66* (2013.01)

(58) Field of Classification Search
CPC ... H03F 3/195; H03F 1/083; H03F 2200/451; H04W 52/52
USPC .............. 455/115.1, 127.3, 91, 333; 330/250, 330/255, 311
See application file for complete search history.

(56) References Cited

U.S. PATENT DOCUMENTS

| | | | |
|---|---|---|---|
| 5,903,820 A * | 5/1999 | Hagstrom | ........................ 455/82 |
| 6,016,079 A | 1/2000 | Reffay | |
| 7,768,351 B2 | 8/2010 | Ivanov et al. | |
| 7,902,920 B1 | 3/2011 | Beffa | |
| 7,952,430 B1 | 5/2011 | Beffa | |

* cited by examiner

*Primary Examiner* — Sonny Trinh
(74) *Attorney, Agent, or Firm* — Sterne, Kessler, Goldstein & Fox P.L.L.C.

(57) ABSTRACT

Embodiments provide transmitter topologies that improve the power efficiency and bandwidth of RF transmitters for high transmission power applications. In an embodiment, the common-emitter/source PA of conventional topologies is replaced with a current-input common-base/gate PA, which is stacked on top on an open-collector/drain current-output transmitter. The common-base/gate PA protects the output of the transmitter from large output voltage swings. The low input impedance of the common-base/gate PA makes the PA less susceptible to frequency roll-off, even in the presence of large parasitic capacitance produced by the transmitter. At the same time, the low input impedance of the common-base/gate PA reduces the voltage swing at the transmitter output and prevents the transmitter output from being compressed or modulated. In an embodiment, the DC output current of the transmitter is reused to bias the PA, which results in power savings compared to conventional transmitter topologies.

20 Claims, 7 Drawing Sheets

FIG. 1
Conventional

WIDEBAND POWER EFFICIENT HIGH TRANSMISSION POWER RADIO FREQUENCY (RF) TRANSMITTER

CROSS REFERENCE TO RELATED APPLICATIONS

The present application is a continuation of U.S. application Ser. No. 13/249,741, filed Sep. 30, 2011, which is incorporated herein by reference in its entirety.

BACKGROUND

1. Field of the Invention

The present invention relates generally to radio frequency (RF) transmitters.

2. Background Art

High-power transmitters require a power amplifier (PA) that can produce a high-voltage signal. Conventional high-power transmitter topologies use a voltage-input PA, such as a common-emitter/source PA or a variation thereof, that is cascaded after the transmitter. Commonly, voltage-input PAs provide non-linear amplification, especially in the B or AB classes of operation. As such, complex linearization techniques (e.g., pre-distortion) are needed in order to achieve specified transmitter EVM (Error Vector Magnitude) and ACPR (Adjacent Channel Power Ratio) mask.

There is a need therefore for improved transmitter topologies for high transmission power applications.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. Generally, the drawing in which an element first appears is typically indicated by the leftmost digit(s) in the corresponding reference number.

DETAILED DESCRIPTION OF EMBODIMENTS

High-power transmitters require a power amplifier (PA) that can produce a high-voltage signal. Conventional high-power transmitter topologies use a voltage-input PA, such as a common-emitter/source PA or a variation thereof, that is cascaded after the transmitter.

Figure 1:
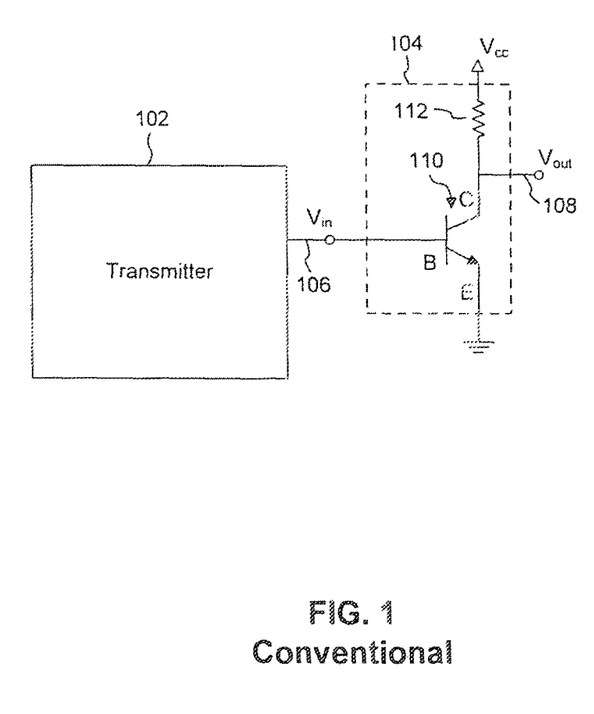
FIG. 1 illustrates a conventional high-power radio frequency (RF) transmitter.

FIG. 1 illustrates a conventional high-power radio frequency (RF) transmitter 100. As shown in FIG. 1, transmitter 100 includes a transmitter circuit 102 and a voltage-input PA 104. Voltage-input PA 104 is a common-emitter PA, which includes a NPN transistor 110 and a pull-up resistor 112. In other implementations, voltage-input PA 104 can be a common-source PA, which includes a NMOS transistor.

PA 104 receives an input voltage 106 from transmitter circuit 102. Input voltage 106 is applied at the base terminal of transistor 110. Based on a voltage-to-current characteristic curve (IV curve), transistor 110 produces a current through its collector terminal. The collector current drives a load (not shown in FIG. 1), which is coupled to the collector terminal of transistor 110, to produce a desired output voltage 108.

PA 104 relies on the linearity of the IV curve of transistor 110. Typically, however, the IV curve of transistor 104 is inherently non-linear, which results in non-linear distortion in output voltage 108. Further, conventional common-emitter/source PAs are significantly non-linear in the B or AB classes of operation, due to the large changes in transistor operation point, which produce large and unpredictable variations in the slope of the IV curve of transistor 110. Complex linearization techniques (e.g., pre-distortion) are thus needed in order to achieve specified transmitter EVM (Error Vector Magnitude) and ACPR (Adjacent Channel Power Ratio) mask.

Embodiments of the present invention provide transmitter topologies that improve the power efficiency and bandwidth of RF transmitters for high transmission power applications. In an embodiment, the common-emitter/source PA of conventional topologies is replaced with a current-input common-base/gate PA, which is stacked on top on an open-collector/drain current-output transmitter. The common-base/gate PA protects the output of the transmitter from large output voltage swings. The low input impedance of the common-base/gate PA makes the PA less susceptible to frequency roll-off, even in the presence of large parasitic capacitance produced by the transmitter. This enables embodiments to operate at very high frequencies. At the same time, the low input impedance of the common-base/gate PA reduces the voltage swing at the transmitter output and prevents the transmitter output from being compressed or modulated. In an embodiment, the DC output current of the transmitter is reused to bias the PA, which results in power savings compared to conventional transmitter topologies.

According to embodiments, the common-base/gate PA can be implemented using a high-voltage process capable of tolerating the large amplitude swings of the transmitter output. For example, embodiments can be implemented using SiGe (Silicon Germanium) Bipolar or BiCMOS, GaAs (Gallium Arsenide), Silicon CMOS (Complementary Metal Oxide Semiconductor) SOI (Silicon on Insulator), Silicon LDMOS (Laterally Diffused Metal Oxide Semiconductor), GaN (Gallium Nitride), Silicon bipolar or BiCMOS, or other suitable processes. The process used for the PA may be different than the process used to implement the current-output transmitter. In an embodiment, the transmitter and PA are implemented in a multi-chip module (MCM) package, with the PA die placed on the transmitter SoC (System on Chip) package substrate. This allows for the PA die to be placed very close to the SoC die, which eliminates the requirement of impedance matching between the transmitter and the PA.

In embodiments, the transmitter is a high-speed DAC-based transmitter (e.g., short-channel high-speed CMOS process DAC), instead of a traditional I/Q direct-conversion RF transmitter. The common-base/gate PA is configured to have much lower input impedance than the output impedance of the DAC-based transmitter. As such, the common-base/gate PA maintains the inherent linearity of the DAC-based transmitter, and transfers substantially all of the input current to the output circuit. In an embodiment, the common-base/gate PA tolerates much higher voltages than the DAC-based transmitter (which is implemented, for example, using a CMOS process), thereby allowing for high power to be generated at the output.

Example embodiments of the present invention will now be provided. These examples are provided for the purpose of illustration only and are not limiting.

Figure 2:
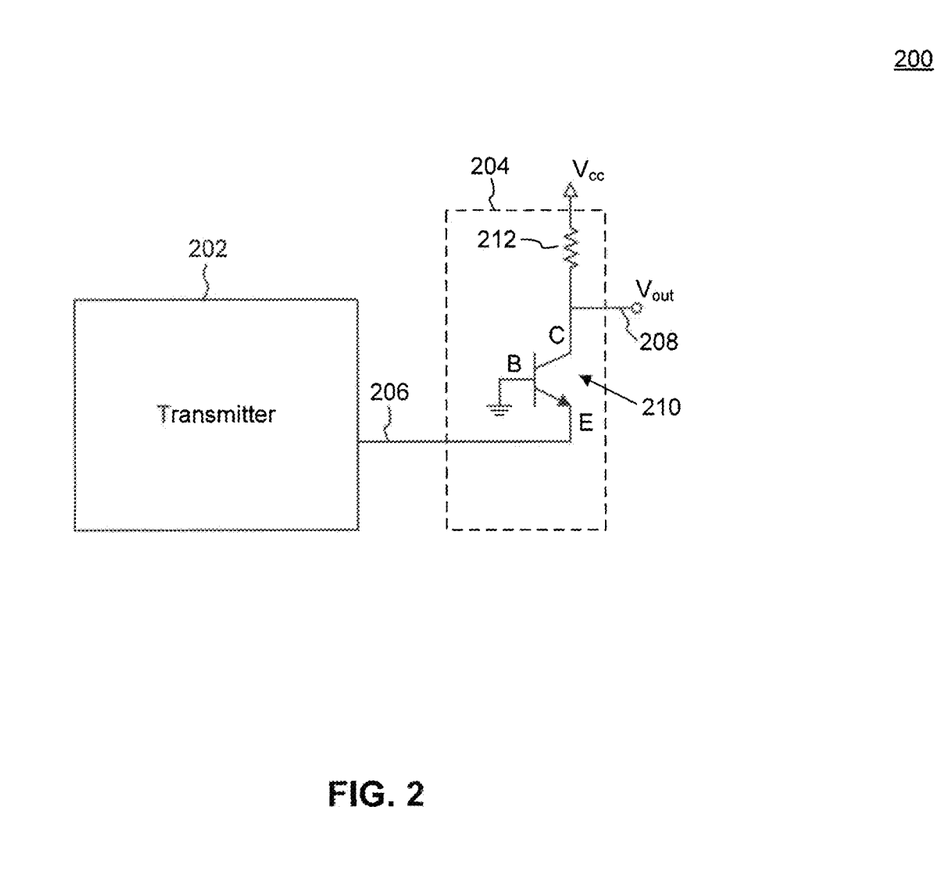
FIG. 2 illustrates an example high-power RF transmitter according to an embodiment of the present invention.

FIG. 2 illustrates an example RIF transmitter 200 according to an embodiment of the present invention. As shown in FIG. 2, example transmitter 200 includes a transmitter circuit 202 and a current-input PA 204. Current-input PA 204 is a common-base PA, which includes a NPN transistor 210 and a pull-up resistor 212. In other implementations, current-input PA 204 can be a common-gate PA, which includes a NMOS transistor. Other known equivalent implementations can also be used, including, for example, the use of PNP or PMOS transistors.

PA 204 receives an input current 206 from transmitter circuit 202. Input current 206 is applied at the emitter terminal of transistor 210, and thus provides the collector-to-emitter current (i.e., collector current) of transistor 210. The collector current drives a load (not shown in FIG. 2), which is coupled to the collector terminal of transistor 210, to produce a desired output voltage 208.

In an embodiment, transmitter circuit 202 is a DAC-based transmitter. In another embodiment, transmitter circuit 202 is implemented using a short-channel high-speed CMOS process, instead of a traditional I/Q direct-conversion RF transmitter. As such, transmitter circuit 202 can generate very high output currents but can tolerate only small voltages (e.g., 2-3 Volts). On the other hand, PA 204, which is implemented, for example, using a SiGe or other similar high-voltage process, tolerates much higher voltages (e.g., a SiGe process NPN can tolerate up to 20 Volts of collector-to-emitter voltage with a cutoff frequency at 30 GHz), which allows for very high power to be produced at the output of example transmitter 200. At the same time, PA 204 protects transmitter circuit 202 from high voltages that can appear at the output.

In another embodiment, PA 204 is configured to have much lower input impedance than the output impedance of transmitter circuit 202. As such, PA 204 maintains the inherent linearity of the DAC-based transmitter circuit 202, and transfers substantially all of input current 206 to PA 204.

According to embodiments, PA 204 can be implemented using a high-voltage process capable of tolerating the large amplitude swings of the output of transmitter circuit 202. For example, PA 204 can be implemented using SiGe bipolar or BiCMOS, GaAs, Silicon CMOS SOI, Silicon LDMOS, GaN, Silicon bipolar or BiCMOS, or other suitable processes. The process used for PA 204 may be different than the process used to implement the transmitter circuit 22.

Figure 3:
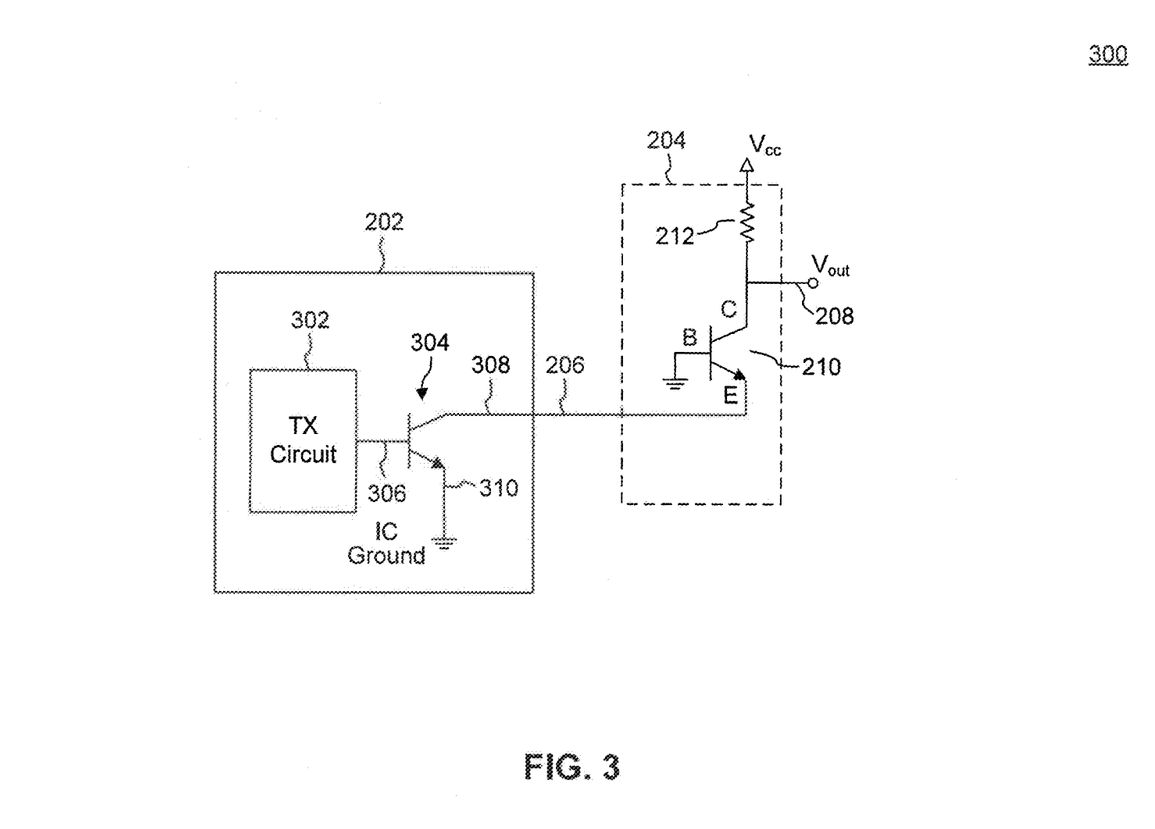
FIG. 3 illustrates another example high-power RF transmitter according to an embodiment of the present invention.

FIG. 3 illustrates another example RF transmitter 300 according to an embodiment of the present invention. Like transmitter 200, transmitter 300 includes transmitter 202 and current-input PA 204.

Transmitter 202 is an open collector current-output transmitter, which includes a transmit (TX) circuit 302 and a NPN transistor 304. TX circuit 302 may include a DAC. The output of TX circuit 302 is applied to the base terminal 306 of NPN transistor 304. The collector terminal 308 of NPN transistor 304 provides the output of transmitter 202.

In an embodiment, TX circuit 302 and NPN transistor 304 are integrated in a single integrated circuit (IC). Accordingly, the collector terminal 308 of NPN transistor 304 is open on a pin of the IC, and the emitter terminal 310 of NPN transistor 304 is coupled internally to a ground pin of the IC.

PA 204 protects the output of transmitter 202 from large output voltage swings. In addition, the low input impedance of PA 204 makes PA 204 less susceptible to frequency roll-off, even in the presence of large parasitic capacitance produced by transmitter 202. This enables example transmitter 300 to operate at very high frequencies. At the same time, the low input impedance of PA 204 reduces the voltage swing at the output of transmitter 202 and prevents the transmitter output from being compressed or modulated. Additionally, in an embodiment, the DC output current of transmitter 202 is reused to bias PA 204, which results in power savings compared to conventional transmitter topologies.

Figure 4:
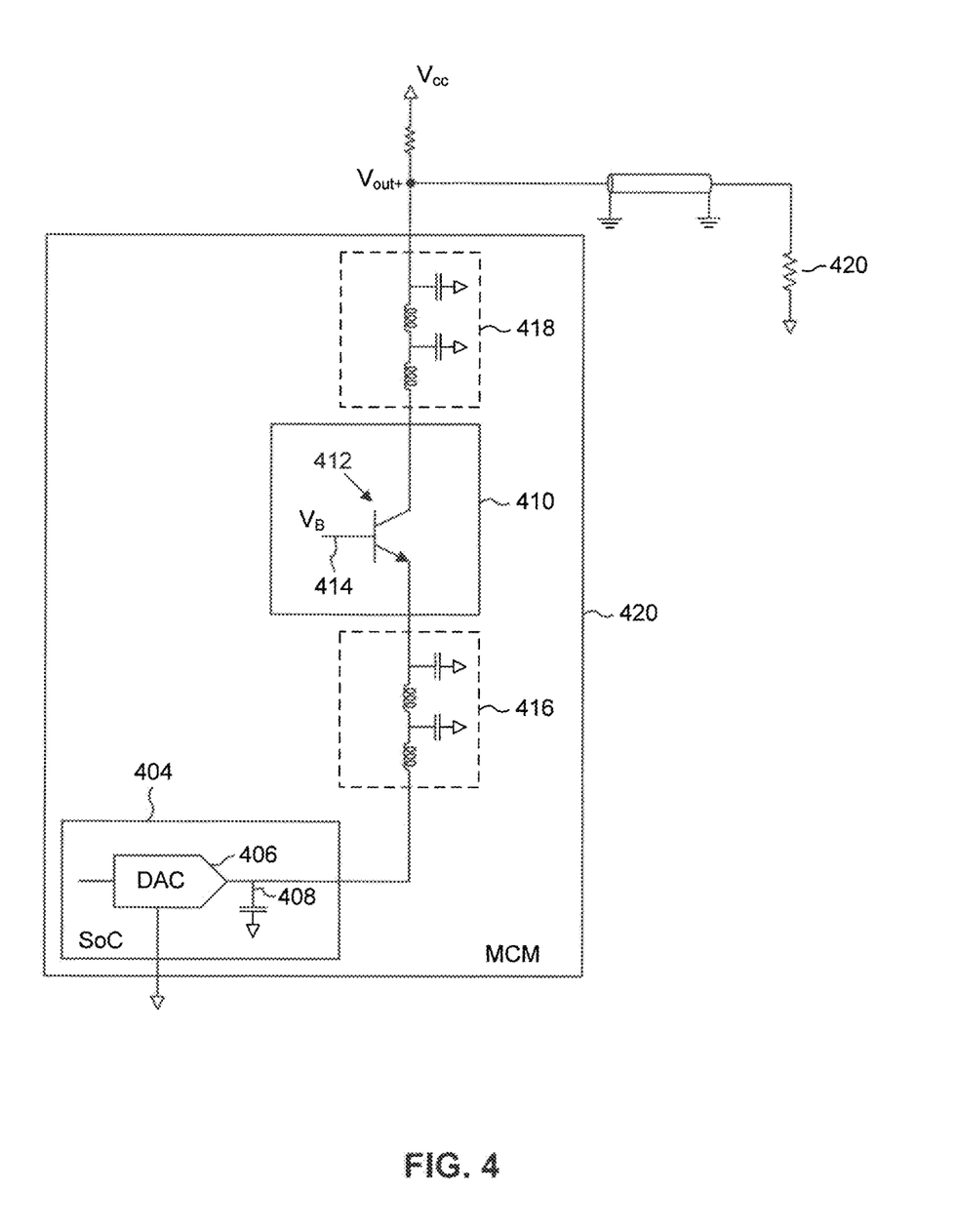
FIG. 4 illustrates an example single-ended high-power RF transmitter topology according to an embodiment of the present invention.

FIG. 4 illustrates an example single-ended RF transmitter topology 400 according to an embodiment of the present invention. As shown in FIG. 4, transmitter topology 400 includes a RF transmitter module 402, coupled via a transmission line to a load 420.

RF transmitter module 402 includes a transmitter circuit 404 and a current-input PA 410. In an embodiment, transmitter circuit 404 is implemented as a SoC (System on Chip), and includes a Short-channel high-speed DAC 406. A capacitor 408 is coupled at the output of DAC 406 to reduce the parasitics of transmitter circuit 404. In an embodiment, transmitter circuit 404 and PA 410 are implemented in a multi-chip module (MCM) package, with the PA die placed on the transmitter SoC package substrate. This allows for PA 410 die to be placed very close to the SoC die, which eliminates the requirement of impedance matching between transmitter circuit 404 and PA 410.

PA 410 is a common-base PA, which includes a NPN transistor 412. In other implementations, PA 410 can be a common-gate PA, which includes a NMOS transistor. Other known equivalent implementations can also be used, including, for example, the use of PNP or PMOS transistors. A bias voltage 414 is applied at the base terminal of NPN transistor 412. In an embodiment, the DC output current of transmitter circuit 404 is reused to generate bias voltage 414, which results in power savings compared to conventional transmitter topologies.

According to embodiments, PA 410 can be implemented using a high-voltage process capable of tolerating the large amplitude swings of the output of transmitter circuit 404. For example, PA 410 can be implemented using SiGe bipolar or BiCMOS, GaAs, Silicon CMOS SOI, Silicon LDMOS, GaN, Silicon bipolar or BiCMOS, or other suitable processes. The process used for PA 410 may be different than the process used to implement the transmitter circuit 404.

In an embodiment, PA 410 is characterized by a low input impedance, which makes PA 410 less susceptible to frequency roll-off, even in the presence of large parasitic capacitance produced by transmitter circuit 404. This enables RF transmitter module 402 to operate at very high frequencies. At the same time, the low input impedance of PA 410 reduces the voltage swing at the output of transmitter circuit 404 and prevents the transmitter output from being compressed or modulated. In an embodiment, to maintain these benefits, transmitter circuit 404 and PA 410 are connected using a very low impedance transmission line 416. For example, for a load 420 of 50 Ohms, the impedance of transmission line 416 may be as low as 3 Ohms. Additionally, the output of PA 410 is tied to a choke circuit 418, which increases the voltage headroom at the output of RF transmitter module 402 and also improves power efficiency.

Figure 5:
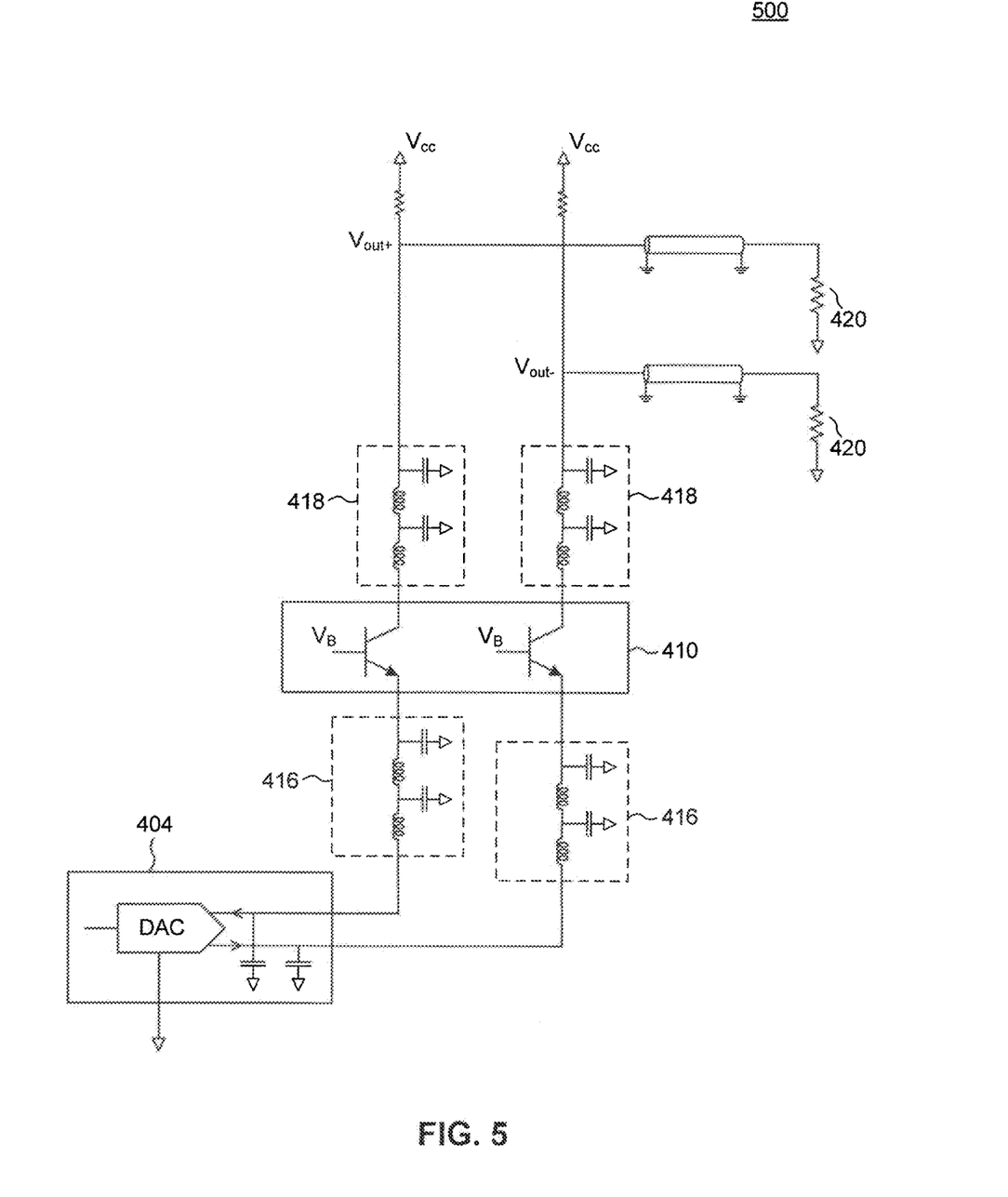
FIG. 5 illustrates an example differential high-power RF transmitter topology according to an embodiment of the present invention.

FIG. 5 illustrates an example differential RF transmitter topology 500 according to an embodiment of the present invention. As shown in FIG. 5, example topology 500 includes two identical branches, each of which corresponds to example topology 400 described above in FIG. 4.

Figure 6:
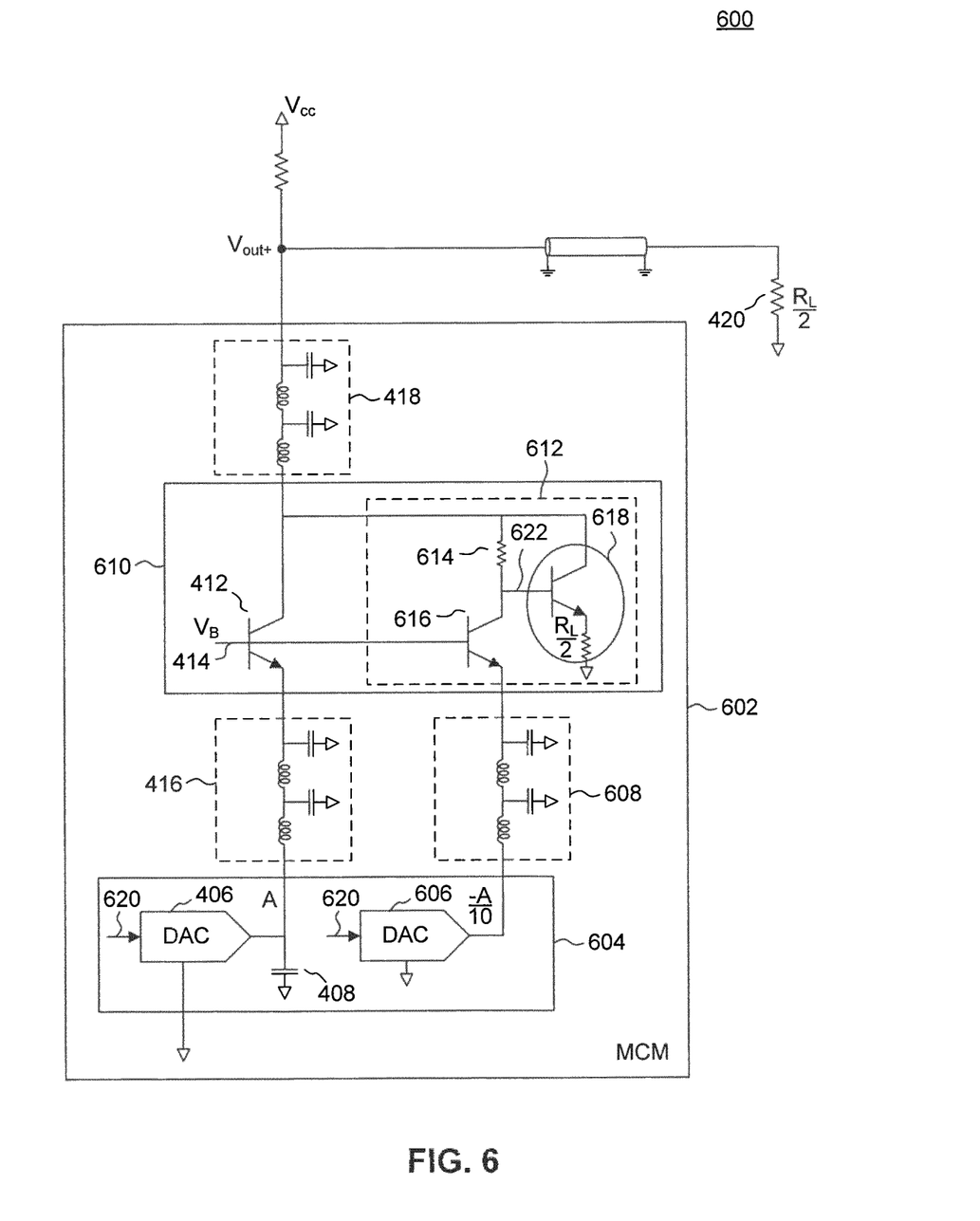
FIG. 6 illustrates an example high-power RIF transmitter topology with active source termination according to an embodiment of the present invention.

FIG. 6 illustrates an example RF transmitter topology 600 with active source termination according to an embodiment of the present invention. Active source termination, according to embodiments, improves the power efficiency, output bandwidth, and S22 coefficient (output reflection coefficient of 50 ohm terminated input) of the RF transmitter.

Example topology 600 corresponds to example topology 400, described above in FIG. 4, with active termination circuitry added. As shown in FIG. 6, transmitter topology 600 includes a RF transmitter module 602, coupled via a transmission line to a load 420. RF transmitter module 602 includes a transmitter circuit 604 and a current-input PA 610.

Transmitter circuit 604 includes a main DAC 406 and an auxiliary DAC 606. Auxiliary DAC 606 is used for active termination as further described below. In an embodiment, DACs 406 and 606 are short-channel high-speed DACs. PA 610 includes NPN transistor 412 and an active termination circuit 612. In an embodiment, transmitter circuit 604 and PA 610 are implemented in a multi-chip module (MCM) package, with the die that includes PA 610 placed on the package substrate of the SoC die that includes transmitter circuit 604. This allows for the die that includes PA 610 to be placed very close to the SoC die, which eliminates the requirement of impedance matching between transmitter circuit 604 and PA 610.

Active termination circuit 612 is coupled to the output of auxiliary DAC 606. In an embodiment, as shown in FIG. 6, active termination circuit 612 includes a resistor 614, a NPN transistor 616, and a controlled current source 618.

As would be understood by a person of skill in the art based on the teachings herein, active termination circuits according to embodiments can be implemented using a variety of circuit implementations other than active termination circuit 612. For example, resistor 614 may be implemented as an impedance network of any type. Further, controlled current source 618 may be implemented in any known manner for implementing controlled current sources. In an embodiment, current source 618 is a digitally controlled DAC. Alternatively, current source 618 is an analog amplifier, such as a BJT or MOS transistor amplifier, for example. Embodiments may also employ any of the active termination methods and systems described in U.S. application Ser. No. 13/174,059, filed Jun. 30, 2011, which is incorporated herein by reference in its entirety.

According to embodiments, active termination circuit 612 is configured so as to draw only a small fraction of the output current generated by DAC 406, thereby increasing the power efficiency of RF transmitter module 602. In an embodiment, the fraction of the output current drawn by active termination circuit 612 is determined by input signal 620 and is configured to increase transfer of the output current of DAC 406 to load 420.

In an embodiment, resistor 614 and auxiliary DAC 606 are configured such that a voltage 622 at a control terminal of controlled current source 618 has zero or near zero alternating current (AC) component. As such, zero or near zero alternating current (AC) flows through controlled current source 618, and the only AC current drawn by active termination circuit 612 (i.e., the fraction of the output current) is that generated by auxiliary DAC 606 and which is determined by input signal 620. In an embodiment, resistor 614 is selected based on the current generated by auxiliary DAC 606, so as to cause voltage 622 at the control terminal of controlled current source 618 to have zero or near zero alternating current (AC) component.

In an embodiment, the current generated by auxiliary DAC 606 is configured to be a specified fraction of the output current generated by DAC 406. In an embodiment, auxiliary DC 606 is matched to DAC 406 according to a pre-determined ratio (e.g., auxiliary DAC 606 may be a scaled down replica of DAC 406), which corresponds to the ratio of the fraction of the output current to be generated by auxiliary DAC 606 to the output current generated by DAC 406. For example, DACs 406 and 606 may be matched according to a 10:1 ratio, such that the current generated by auxiliary DAC 606 is $1/10^{th}$ the current generated by DAC 406. As such, the termination efficiency of circuit 612 is equal to 81% ($0.9^2$).

According to embodiments, the output impedance of RF transmitter module 602, determined at the output terminal Vout+ of RF transmitter module 602, substantially matches the load impedance $R_L/2$. The output impedance of RF transmitter module 602 is primarily determined by controlled current source 618. In an embodiment, controlled current source 618 is implemented as shown in FIG. 6 (or as a diode-connected transistor) so as to have an output impedance equal to the load impedance $R_L/2$.

Figure 7:
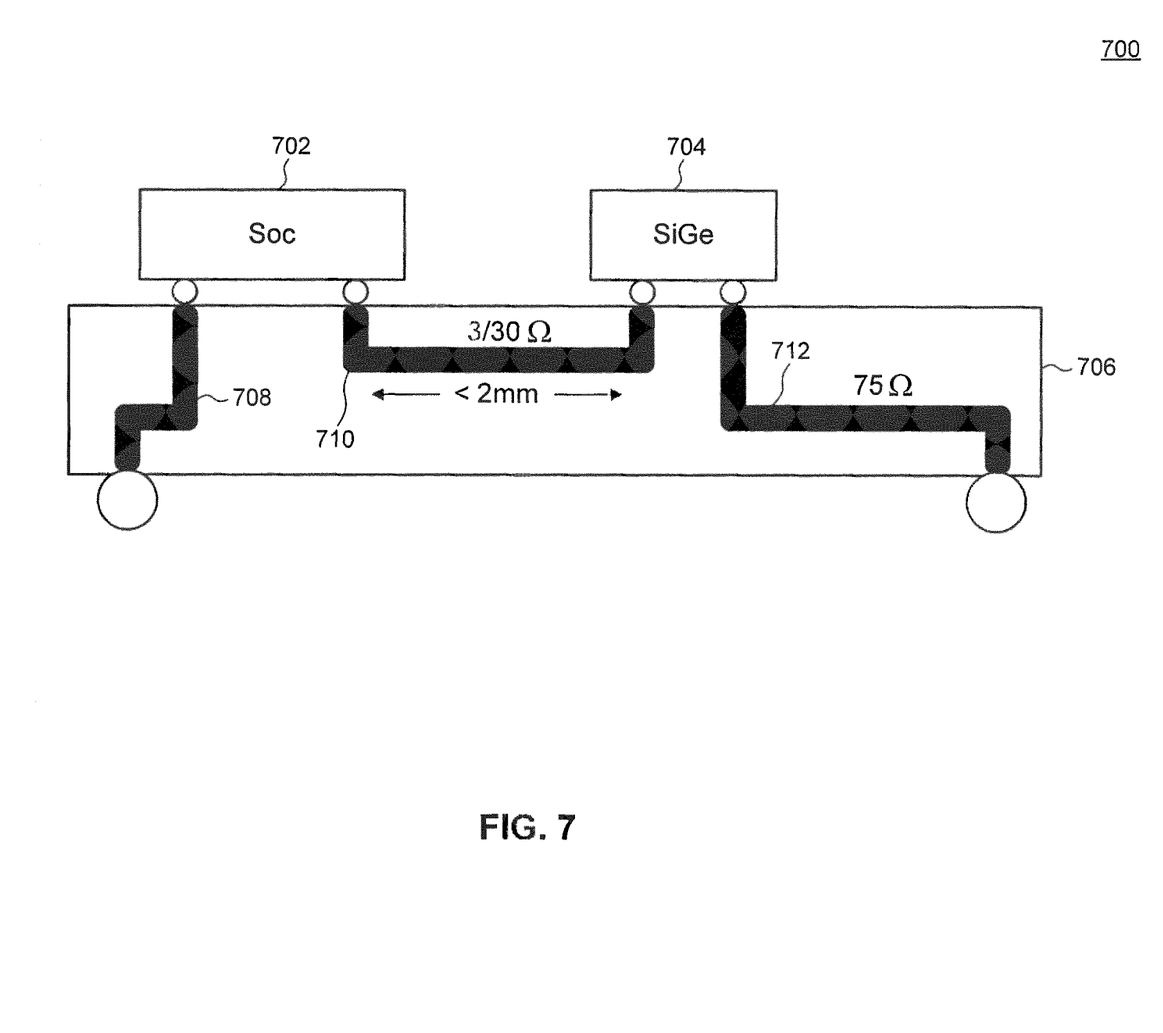
FIG. 7 illustrates an example multi-chip module (MCM) for implementing embodiments of the present invention.

FIG. 7 illustrates an example multi-chip module (MCM) 700 for implementing embodiments of the present invention. As shown in FIG. 7, example MCM 700 includes a transmitter SoC 702, a SiGe PA chip 704, and a substrate 706. In an embodiment, as shown in FIG. 7, SoC 702 and SiGe PA chip 704 are flip-chips and are interconnected with substrate 706 via respective solder/stud bumps. Alternatively, SoC 702 and SiGe PA chip 704 may be interconnected with substrate 706 via respective wire bonds or similar connections. Substrate 706 provides SoC 702 and 704 respective ground paths 708 and 712.

In an embodiment, substrate 706 is the package substrate of SoC 702. As such, SiGe PA chip 704 can be placed very close to SoC 702. For example, in an embodiment, SoC 702 and SiGe PA 704 are connected via a trace 710 that is less than 2 millimeters long. At operating wavelengths, trace 710 becomes the equivalent of an electrical short, which eliminates the requirement of impedance matching between the transmitter (included in SoC 702) and the PA (included in SiGe PA chip 704) and improves power efficiency.

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present invention should not be limited by any of the above-described exemplary embodiments, but should be defined only in accordance with the following claims and their equivalents.

What is claimed is:

1. A multi-chip module (MCM), comprising:
a substrate;
a transmitter System on Chip (SoC) including a current-output transmitter circuit configured to generate an output current; and
a power amplifier (PA) chip including a current-input PA configured to receive the output current and generate a desired output voltage across a load,
wherein the transmitter SoC and the PA chip are located on the substrate.

2. The MCM of claim 1, wherein the substrate includes a package substrate of the transmitter SoC.

3. The MCM of claim 1, wherein the transmitter SoC and the PA chip are implemented as flip-chips on the substrate.

4. The MCM of claim 1, wherein the transmitter SoC is implemented using a first process technology and the PA chip is implemented using a second process technology.

5. The MCM of claim 4, wherein the second process technology tolerates higher voltage levels than the first process technology.

6. The MCM of claim 4, wherein the first process technology is a short-channel Complementary Metal Oxide Semiconductor (CMOS) process, and the second process technology is a Silicon Germanium (SiGe) process.

7. The MCM of claim 1, wherein the current-input PA includes one of a common-base PA and a common-gate PA.

8. The MCM of claim 1, wherein the current-output transmitter circuit includes one of an open-collector transmitter and an open-drain transmitter.

9. A multi-chip module (MCM), comprising:
a substrate;
a transmitter System on Chip (SoC) including a current-output transmitter circuit; and
a power amplifier (PA) chip including a current-input PA,
wherein the transmitter SoC and the PA chip are located on the substrate, and
wherein the current-output transmitter circuit includes a digital-to-analog converter (DAC)-based transmitter circuit.

10. The MCM of claim 9, wherein an input impedance of the current-input PA is lower than an output impedance of the DAC-based transmitter circuit.

11. A radio frequency (RF) transmitter, comprising:
a transmitter circuit, implemented using a first process technology, configured to generate an output current; and
a current-input power amplifier (PA), implemented using a second process technology, configured to receive the output current from the transmitter circuit and to generate a desired output voltage across a load,
wherein the second process technology tolerates higher voltage levels than the first process technology.

12. The RF transmitter of claim 11, wherein the transmitter circuit is located on a first die and the current-input PA is located on a second die.

13. The RF transmitter of claim 12, wherein the first die and the second die are integrated in a multi-chip module (MCM).

14. The RF transmitter of claim 13, wherein the MCM module comprises a package substrate of the first die, and wherein the second die is located on the package substrate of the first die.

15. The RF transmitter of claim 11, wherein the current-input PA includes one of a common-base PA and a common-gate PA.

16. A multi-chip module (MCM), comprising:
a package substrate;
a digital-to-analog converter (DAC) configured to generate an output current; and
a current-input power amplifier (PA) configured to receive the output current from the DAC and to generate a desired output voltage across a load,
wherein the DAC and the current-input PA are located on the package substrate.

17. The MCM of claim 16, wherein the DAC is integrated in a System on Chip (SoC), and wherein the package substrate includes a package substrate of the SoC.

18. The MCM of claim 17, wherein the current-input PA is integrated in a PA chip, and wherein the PA chip and the SoC are connected using a low impedance transmission line.

19. The MCM of claim 16, wherein the DAC is implemented using a first process technology and the current-input PA is implemented using a second process technology.

20. The MCM of claim 19, wherein the second process technology tolerates higher voltage levels than the first process technology.

* * * * *